US006768263B2

(12) United States Patent
Aiura et al.

(10) Patent No.: US 6,768,263 B2
(45) Date of Patent: Jul. 27, 2004

(54) SHORT ARC TYPE MERCURY LAMP

(75) Inventors: Yoshinori Aiura, Hyogo (JP); Yukio Yasuda, Hyogo (JP)

(73) Assignee: Ushio Denki Kabushiki Kaisya, Tokyo (JP)

( * ) Notice: Subject to any disclaimer, the term of this patent is extended or adjusted under 35 U.S.C. 154(b) by 34 days.

(21) Appl. No.: 10/281,120

(22) Filed: Oct. 28, 2002

(65) Prior Publication Data

US 2003/0094901 A1 May 22, 2003

(30) Foreign Application Priority Data

Oct. 30, 2001  (JP) ........................................ 2001-332659

(51) Int. Cl.[7] .......................... H01J 17/06; H01J 61/06
(52) U.S. Cl. ..................... 313/632; 313/326; 313/311; 313/631
(58) Field of Search ................. 313/631, 632, 313/326, 311; 445/50, 51

(56) References Cited

U.S. PATENT DOCUMENTS 4,117,367 A * 9/1978 DE Bie et al. ............. 313/632
5,422,539 A * 6/1995 Chodora ..................... 313/631
5,911,919 A * 6/1999 Billings ..................... 313/326
6,109,995 A * 8/2000 Altmann et al. ............. 445/49
6,215,247 B1 * 4/2001 Kurano et al. ............. 313/632

FOREIGN PATENT DOCUMENTS

| JP | 54050160 A | * | 4/1979 | .......... H01J/61/073 |
| JP | 56-134465 | | 10/1981 | |
| JP | 02295056 A | * | 12/1990 | .......... H01J/61/073 |
| JP | 03283255 A | * | 12/1991 | .......... H01J/61/073 |
| JP | 2001-351573 | | 12/2001 | |
| JP | 2002-110083 | | 4/2002 | |

* cited by examiner

Primary Examiner—Nimeshkumar D. Patel
Assistant Examiner—Mariceli Santiago
(74) Attorney, Agent, or Firm—Oblon, Spivak, McClelland, Maier & Neustadt, P.C.

(57) ABSTRACT

A short arc type mercury lamp in which a cathode and an anode are disposed opposite one another inside an arc tube, at least a noble gas and mercury are filled into the arc tube, cathode contains thorium oxide, a cone-shaped part that continues on from a cathode body is formed on the cathode, and a protruding part that continues on from the cone-shaped part is formed, wherein the number of grain boundaries on a straight line that passes through the approximate center of an arbitrary section in the radial direction of the protruding part is at least 0.5 per mm but not more than 100 per mm.

2 Claims, 4 Drawing Sheets

(a)

(b)

0.1mm

SHORT ARC TYPE MERCURY LAMP

BACKGROUND OF THE INVENTION

1. Field of the Invention

The present invention relates to a short arc type mercury lamp that is used in the photochemical industrial field, the semiconductor device manufacturing field or the like, and in particular to an electrode of such a lamp.

2. Description of the Related Art

Conventionally, with regard to short arc type lamps, there has been art in which a protruding part is provided on the top of the cathode to suppress arc-wandering of the electrical discharge. This is disclosed in, for example, Japanese Patent Application Laid-open No. 56-134465 (1981).

In the above-mentioned publication, a description is given with regard to a xenon lamp.

A cause of 'arc-wandering' is that the tip of the cone-shaped part of the cathode, which is pointed when the lamp is first used, becomes to have a spherical surface of large radius as usage time passes due to the tungsten and the electron-emitting substance melting and evaporating, and moreover the structure of the tip part changes, with a tungsten monocrystal being formed and growing, and hence the pointedness is lost, and channel of the electron-emitting substance into the tip part through diffusion is inhibited due to the formation of the monocrystal. In the above-mentioned publication, it is disclosed that by restricting the monocrystal advancement region to a protruding part, the cathode arc-generating point is restricted to the protruding part, which protrudes out from the tip of the cone-shaped part.

With short arc type mercury lamps used in the photochemical industrial field, the semiconductor device manufacturing field and so on, a noble gas and mercury are filled into the arc tube. The coefficients of thermal conductivity of filler substances that may be used in such a discharge lamp are in the order Ar>Kr>Hg>Xe, and hence the thermal conductivity is the lowest in the case of a xenon lamp, for which the filler gas is Xe only.

To keep the discharge arc in the discharge bulb stable for a long time, a certain temperature is required, and in general it is considered appropriate to carry out operation with the temperature at the cathode tip at about 2700° C. Here, focussing on the filler gas, if thermal conduction is poor, then the arc will be prone to spreading out, and if thermal conduction is good, then it will be easy to narrow down the arc. If the arc is narrowed down, then the current density increases. Naturally, the current density at the cathode tip also increases. If the current density increases, then there is greater damage to the cathode. The temperature at the cathode tip also naturally increases. By making the cathode tip have a protruding shape, the temperature at the cathode tip is more prone to rising than with a conventional tapered shape or the like. In addition, through the effects of the filler substance, the cathode tip becomes hotter in a mercury lamp than in a xenon lamp.

The center of the arc is at a high temperature, and the heat here travels to the surroundings through thermal conduction and so on. If thermal conduction is good, then heat travels rapidly from the high-temperature region, and hence heat escapes to the surroundings. The region in which the arc is formed (the high-temperature region) thus becomes narrow. The arc thus looks more narrowed down with a gas such as Ar than with Xe.

However, the inside of the arc is in a plasma state in which the gas or mercury is ionized. A current flows due to the movement of electrons and ions within the plasma. The arc being narrowed down means that the path along which the current travels is narrow. The current density is thus higher with a gas such as Ar than with Xe.

If the current density rises, then a central region of yet higher temperature is produced. The cathode tip, which is centrally positioned, is thus subjected to a yet higher temperature, and hence the temperature of the cathode tip tends to increase.

As a result, evaporation of thorium (Th), which is the electron-emitting substance, occurs more fiercely with a mercury lamp than with a xenon lamp, and hence the thorium is used up. Moreover, contraction of the arc spot called spot mode (a state in which the arc spot becomes point-like) is more prone to occur than with a xenon lamp. That is, fluctuation in the irradiance is brought about.

Furthermore, with a mercury lamp, because the load on the cathode tip is heightened, i.e. because the temperature at the cathode tip is more prone to becoming high, deformation of the cathode tip has frequently been seen to be brought about.

SUMMARY OF THE INVENTION

It is thus an object of the present invention to provide a short arc type mercury lamp according to which desired electrons can be discharged, contraction and wandering of the arc spot of the arc are suppressed, the cathode shape is not prone to deforming even if the lamp is lit for a long time, and fluctuation in the illuminance is suppressed.

The electron-emitting substance thorium separates out from grain boundaries inside the cathode, and this thorium makes emission of electrons at the cathode tip possible at a lower temperature than with tungsten, and thus carries out an electron discharge operation. In the case that carburization has been carried out, a large amount of thorium flows from the carburized surface, and is supplied to the tip through surface diffusion and so on.

As a result of assiduous studies, the present inventors have ascertained that, in the case of a mercury lamp having a protruding part on the cathode, arc-wandering such as spot mode and deformation of the cathode tip occur in accordance with the state of grain boundaries within the protruding part, specifically the number of grain boundaries intersecting a straight line that passes through the approximate center of an arbitrary section in the radial direction of the protruding part.

Moreover, with a mercury lamp having a cathode with a protruding part at the tip, because the cathode temperature is more prone to becoming high than with a conventional mercury lamp having a cathode with no protruding part or a conventional xenon lamp, there have been cases in which deformation of the cathode occurs markedly. Upon investigating the reason for this, it was found that this occurs in the case that the number of grain boundaries within the protruding part is extremely high.

If the number of grain boundaries becomes high, then this equates to voids having enlarged, which corresponds to thermal conduction having become worse. The flow of energy from the cathode tip to the cathode body is thus obstructed, and hence an abnormal temperature rise occurs at the tip. It is conjectured that the cathode tip undergoes deformation as a result.

To solve the above problems, an invention claimed in claim 1 is a short arc type mercury lamp in which a cathode and an anode are disposed opposite one another inside an arc tube, at least a noble gas and mercury are filled into the arc tube, a cone-shaped part that contains thorium oxide and continues on from the cathode body is formed on the cathode, and a protruding part that continues on from the cone-shaped part is formed; wherein the number of grain boundaries intersecting a straight line that passes through the approximate center of an arbitrary section in the radial direction of the protruding part is at least 0.5 per mm but not more than 100 per mm.

Moreover, an invention disclosed in claim 2 is a short arc type mercury lamp in which a cathode and an anode are disposed opposite one another inside an arc tube, at least a noble gas and mercury are filled into the arc tube, a cone-shaped part that contains thorium oxide and continues on from the cathode body is formed on the cathode, a protruding part that continues on from the cone-shaped part is formed, and at least part of the cone-shaped part and the cathode body is carburized; wherein the number of grain boundaries intersecting a straight line that passes through the approximate center of an arbitrary section in the radial direction of the protruding part is not more than 100 per mm.

By stipulating the number of grain boundaries intersecting a straight line that passes through the approximate center of an arbitrary section in the radial direction of the protruding part at the cathode tip to be at least 0.5 per unit length of 1 mm, it is possible to produce a discharge lamp for which arc-wandering is suppressed.

Moreover, by stipulating the number of grain boundaries intersecting a straight line that passes through the approximate center of an arbitrary section in the radial direction of the protruding part at the cathode tip to be not more than 100 per unit length of 1 mm, it is possible to provide a discharge lamp for which arc-wandering is suppressed, and there is little deformation of the cathode, even in the case of a mercury lamp having a protruding part at the cathode tip whose cathode temperature is more prone to becoming high.

Under the above conditions, with an aim of supplying thorium smoothly, if the side of the cone-shaped part and so on is carbonized, then it becomes easy to supply a sufficient amount of thorium from the cathode side to the cathode tip. By carrying out carbonization, the supply is possible. Emission of thermoelectrons is possible at a lower temperature with thorium than with tungsten. Consequently, emission of thermoelectrons becomes possible over a broader range than in the case that carbonization is not carried out, and hence the load on the cathode can be reduced. Proper cathode operation thus becomes possible even in the case that the number of grain boundaries intersecting a straight line that passes through the approximate center of an arbitrary section in the radial direction of the protruding part at the cathode tip is 0.5 or less per unit length of 1 mm, which led to arc-wandering in the case that carburization is not carried out.

Figure 1:
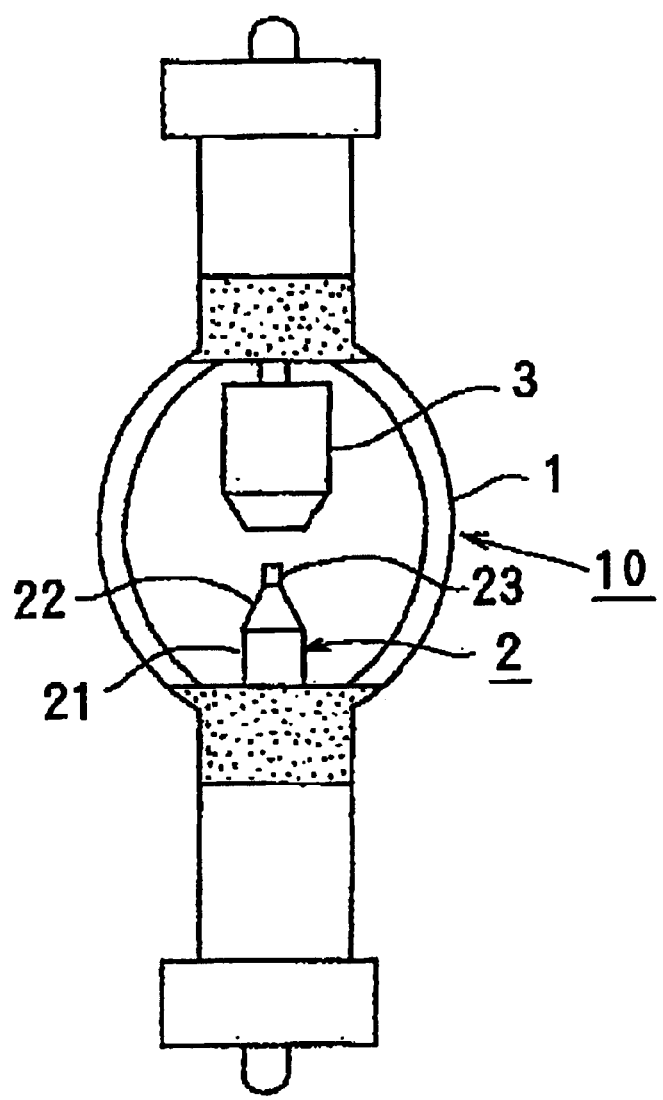
FIG. 1 shows a schematic drawing of a short arc type mercury lamp of the present invention.

DESCRIPTION OF THE SYMBOLS 1 arc tube
2 cathode
3 anode
10 short arc type mercury lamp
21 cathode body
22 cathode cone-shaped part
23 cathode protruding part

DESCRIPTION OF THE PREFERRED EMBODIMENTS

Following is a description of embodiments of the present invention, showing specific examples of the present invention.

EXAMPLES 1

FIG. 1 shows a schematic drawing of a short arc type mercury lamp 10 according to the present invention.

An arc tube 1 that comprises quartz glass has an outside diameter of 55 mm, and both ends of the arc tube 1 are hermetically sealed. A cathode 2 and an anode 3 are disposed opposite one another inside the arc tube 1, and the distance between the cathode 2 and the anode 3 (the inter-electrode distance) is 4.5 mm. 4 mg of mercury per $cm^3$ of the internal volume of the arc tube, and krypton gas having a pressure of 0.15 MPa at room temperature, are filled into the arc tube 1. When the lamp 10 was lit at a constant power of 2.5 kW using a constant-power power source, the power was 2500W=lamp voltage 23V×current 108.7 A.

Figure 2:
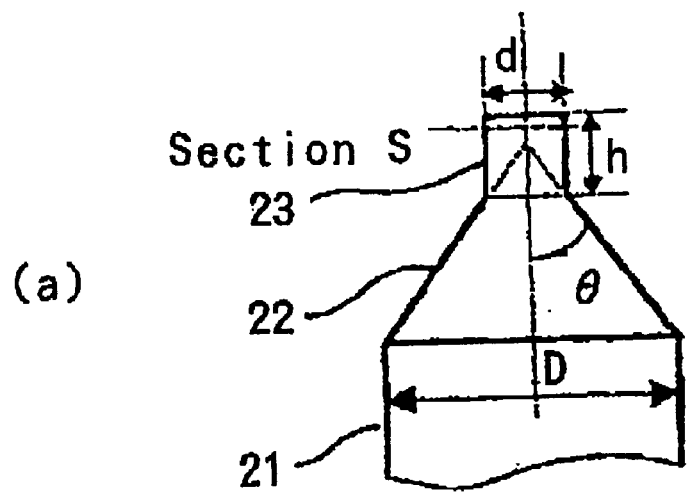
FIG. 2 shows shape parameters for the cathode of the short arc type mercury lamp of the present invention.
Figure 2:
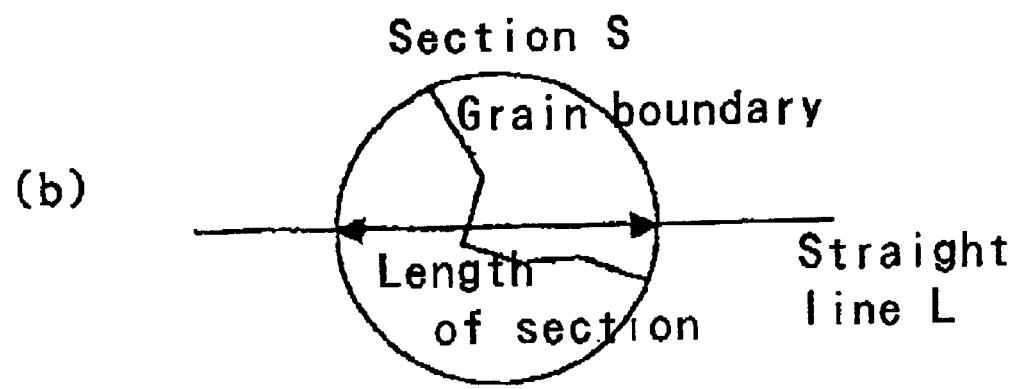

The shape parameters of the cathode 2 of the lamp 10 are shown in FIG. 2(a) and FIG. 2(b). A cone-shaped part 22 continues on from a cathode body 21, and there is a cathode protruding part 23 at the tip of the cone-shaped part 22. The cone angle 20 of the cathode tip part was made to be 60°, the diameter D of the electrode body 6 mm, and the cathode protrusion length h 1 mm; twelve cathodes were prepared, each having a different number of grain boundaries per unit length along a straight line passing through the approximate center of an arbitrary section in the radial direction of the protruding part as shown by A1 to K1 in the Table 1. (a), and tests were carried out in which each lamp was lit, and fluctuation in the illuminance and the extent of deformation of the cathode tip wore investigated. By changing the manufacturing method and the heat treatment method of the thoriated tungsten, the diameter d of the protruding part and the number of grain boundaries along the section S were changed, and thus changed the number of grain boundaries per unit length on the straight line L passing through the approximate center of the section S.

Here, the shape of the protruding part was made to be a circular cylinder continuing on from the cone-shaped part, and initially the diameter of the tip and the length of the section were equal to one another. To check the number of grain boundaries, the tip of the protruding part was polished to expose a crystal face, a photograph was taken, a straight line was drawn through the approximate center of the section on the photograph, and the length of the section, which is the distance between the two points where the straight line intersects the outer periphery, was measured, and the number of grain boundaries intersecting the straight line was counted. The number of grain boundaries per unit length was defined as the value obtained by dividing the number of grain boundaries by the length of the section. An example of counting the number of grain boundaries from the photograph of the crystal face is shown in FIG. 3.

Figure 3:
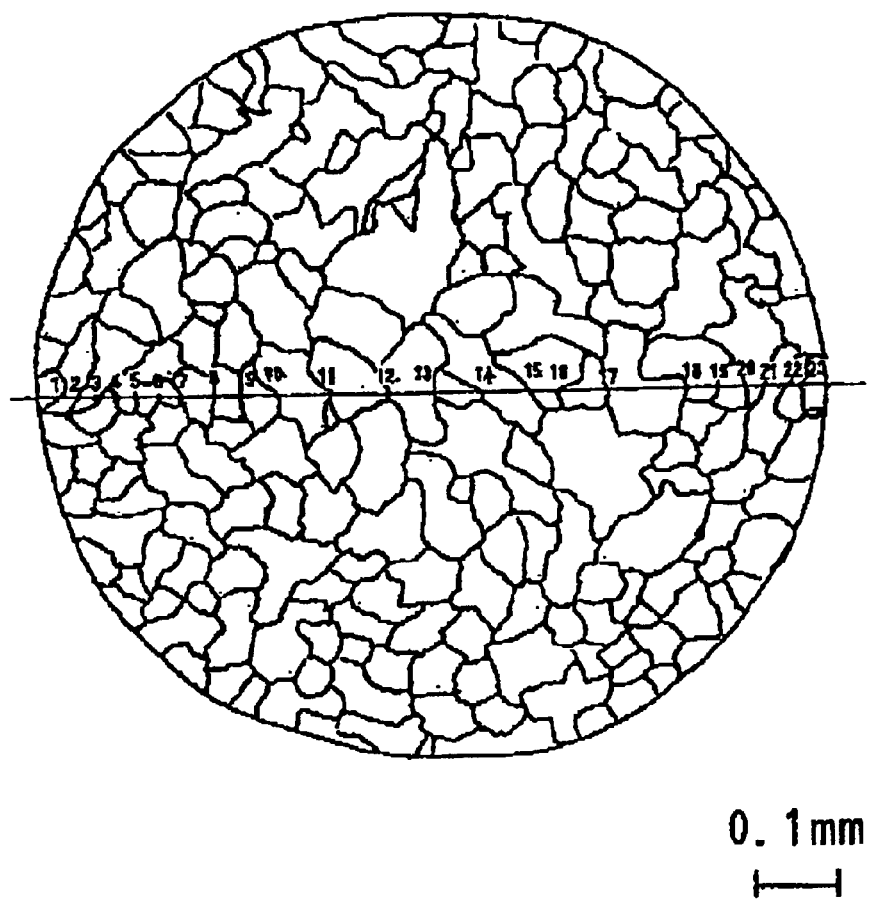
FIG. 3 shows a traced drawing of a photograph of an arbitrary section of the protruding part at the cathode tip in the present invention.
Figure 4:
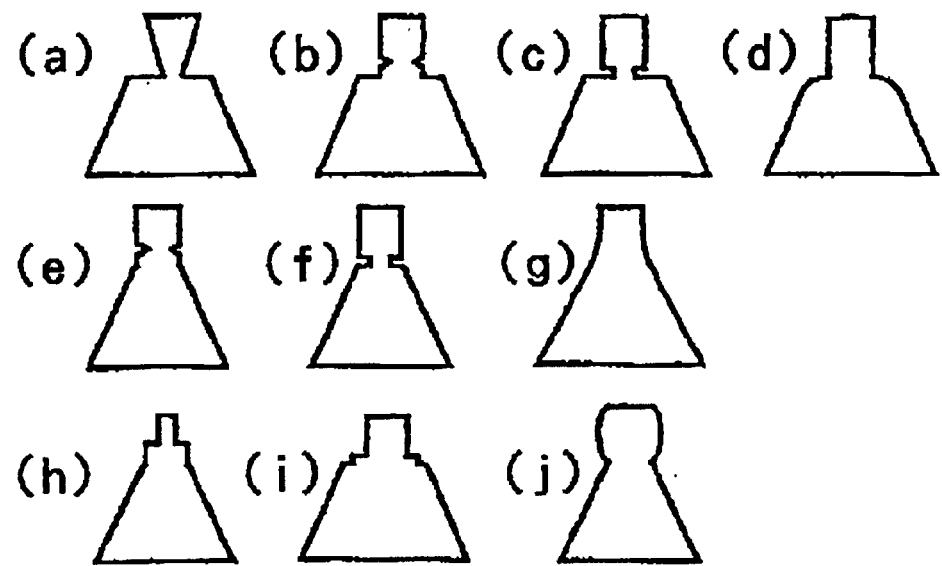
FIG. 4 shows various examples of the shape of the protruding part at the cathode tip used in the mercury lamp according to the present invention.

In FIG. 3, the numbers on the straight line indicate the positions of intersection points between grain boundaries and the straight line; in this example, the number of grain boundaries counted is 23.

Moreover, when the lamps shown in the Table 1. (a) were lit, with some of the lamps, the cathode tip underwent deformation. As for the lamps whose deformation was large, the irradiance maintenance rate was also poor, which was a problem.

The results of the experiments are shown in the Table 1. (a). Table 1, shows results of experiments in which arc-wandering and deformation of the cathode shape were investigated for short arc type mercury lamps of the present invention. This table shows whether or not there was fluctuation in the irradiation, and whether or not there was deformation. From the left of the table are entered the lamp sample symbol, the length of the section through the protruding part of the cathode, the number of grain boundaries along the section through the protruding part, the number of grain boundaries that pass through the approximate center of the section in the radial direction of the protruding part, whether or not there was arc-wandering, whether or not there was cathode deformation, and the overall evaluation.

It can be seen that for the lamps whose number of grain boundaries per unit length was 0.5 per mm or more, there was no arc-wandering. Moreover, it was found that for the lamps whose number of grain boundaries per unit length exceeded 100 per mm, there was great deformation. In other words, it was found that if the number of grain boundaries per unit length on a straight line that passes through the approximate center of an arbitrary section in the radial direction of the protruding part is at least 0.5 per mm but not more than 100 per mm, then arc-wandering is not brought about, and there is no deformation over a prolonged time.

Moreover, the cases that the protrusion length h of the protruding part of the cathode was changed to 0.5 mm and 2.0 mm are shown in the tables in Table 1. (b) and Table 1. (c) respectively. Table 1. (b) is for five lamp samples (L1 to P1) having h of 0.5 mm, and Table 1. (c) is for five lamp samples (Q1 to U1) having h of 2.0 mm.

As with the 1.0 mm case, it was found that if the number of grain boundaries per unit length on a straight line that passes through the approximate center of an arbitrary section in the radial direction of the protruding part is at least 0.5 per mm but not more than 100 per mm, then arc-wandering is not brought about, and there is no deformation over a prolonged time.

TABLE 1

| | Lamp sample | Length of section (mm) | Number of grain boundaries along section through protruding part | Number of grain boundaries per unit length (number/mm) | Arc-wandering | Deformation of cathode tip | Verdict |
|---|---|---|---|---|---|---|---|
| | Presence/absence of arc-wandering and presence/absence of deformation for lamps having a cathode protruding part of length 1 mm | | | | | | |
| (a) | A1 | 0.5 | 0 (monocrystal) | 0 | X | ◯ | X |
| | B1 | 0.5 | 10 | 20 | ◯ | ◯ | ◯ |
| | C1 | 0.5 | 55 | 110 | ◯ | X | X |
| | D1 | 0.9 | 23 | 25.6 | ◯ | ◯ | ◯ |
| | E1 | 0.9 | 145 | 161 | ◯ | X | X |
| | F1 | 2.0 | 200 | 100 | ◯ | ◯ | ◯ |
| | G1 | 2.0 | 1 | 0.5 | ◯ | ◯ | ◯ |
| | H1 | 2.5 | 0 (monocrystal) | 0 | X | ◯ | X |
| | I1 | 3.0 | 285 | 95 | ◯ | ◯ | ◯ |
| | J1 | 3.0 | 0 (monocrystal) | 0 | X | ◯ | X |
| | K1 | 3.5 | 1 | 0.25 | X | ◯ | X |
| | Presence/absence of arc-wandering and presence/absence of deformation for lamps having a cathode protruding part of length 0.5 mm | | | | | | |
| (b) | L1 | 1.0 | 0 (monocrystal) | 0 | X | ◯ | X |
| | M1 | 2.0 | 1 | 0.5 | ◯ | ◯ | ◯ |
| | N1 | 1.0 | 5 | 5 | ◯ | ◯ | ◯ |
| | O1 | 1.0 | 100 | 100 | ◯ | ◯ | ◯ |
| | P1 | 1.0 | 120 | 120 | ◯ | X | X |
| | Presence/absence of arc-wandering and presence/absence of deformation for lamps having a cathode protruding part of length 2.0 mm | | | | | | |
| (c) | Q1 | 2.0 | 0 (monocrystal) | 0 | X | ◯ | X |
| | R1 | 2.0 | 1 | 0.5 | ◯ | ◯ | ◯ |
| | S1 | 2.0 | 20 | 10 | ◯ | ◯ | ◯ |
| | T1 | 2.0 | 200 | 100 | ◯ | ◯ | ◯ |
| | U1 | 2.0 | 230 | 115 | ◯ | X | X |

EXAMPLES 2

The case that the cathode of each of the lamps was carbonized was also investigated. The results are shown in the Table 2.(a) to Table 2.(c). Table 2, shows results of experiments in which arc-wandering and deformation of the cathode shape were investigated for short arc type mercury lamps of the present invention. Table 2.(a) is for 12 lamp samples (A2 to K2) having a cathode protrusion length h of 1 mm. Table 2. (b) is for five lamp samples (L2 to P2) having h of 0.5 mm, and Table 2.(c) is for five lamp samples (Q2 to U2) having h of 2.0 mm.

TABLE 2

| Lamp sample | Length of section (mm) | Number of grain boundaries along section through protruding part | Number of grain boundaries per unit length (number/mm) | Arc-wandering | Deformation of cathode tip | Verdict |
|---|---|---|---|---|---|---|
| Presence/absence of arc-wandering and presence/absence of deformation for lamps having a cathode protruding part of length 1 mm | | | | | | |
| (a) A2 | 0.5 | 0 (monocrystal) | 0 | ○ | ○ | ○ |
| B2 | 0.5 | 10 | 20 | ○ | ○ | ○ |
| C2 | 0.5 | 55 | 110 | ○ | X | X |
| D2 | 0.9 | 23 | 25.6 | ○ | ○ | ○ |
| E2 | 0.9 | 145 | 161 | ○ | X | X |
| F2 | 2.0 | 200 | 100 | ○ | ○ | ○ |
| G2 | 2.5 | 1 | 0.4 | ○ | ○ | ○ |
| H2 | 2.5 | 0 (monocrystal) | 0 | ○ | ○ | ○ |
| I2 | 3.0 | 290 | 97 | ○ | ○ | ○ |
| J2 | 3.0 | 0 (monocrystal) | 0 | ○ | ○ | ○ |
| K2 | 3.5 | 1 | 0.25 | ○ | ○ | ○ |
| Presence/absence of arc-wandering and presence/absence of deformation for lamps having a cathode protruding part of length 0.5 mm | | | | | | |
| (b) L2 | 2.0 | 0 (monocrystal) | 0 | X | ○ | X |
| M2 | 2.0 | 1 | 0.5 | ○ | ○ | ○ |
| N2 | 1.0 | 7 | 7 | ○ | ○ | ○ |
| O2 | 1.0 | 100 | 100 | ○ | ○ | ○ |
| P2 | 1.0 | 125 | 125 | ○ | X | X |
| Presence/absence of arc-wandering and presence/absence of deformation for lamps having a cathode protruding part of length 2.0 mm | | | | | | |
| (c) Q2 | 2.0 | 0 (monocrystal) | 0 | X | ○ | X |
| R2 | 2.0 | 1 | 0.5 | ○ | ○ | ○ |
| S2 | 2.0 | 32 | 16 | ○ | ○ | ○ |
| T2 | 2.0 | 200 | 100 | ○ | ○ | ○ |
| U2 | 2.0 | 214 | 107 | ○ | X | X |

Looking at the results, it can be seen that there was no arc-wandering regardless of the number of grain boundaries per unit length. It is thought that this is because, compared with Examples 1, by carrying out the carbonization, the supply of thorium from the cathode side became smoother and hence discharge of thermoelectrons was made easier, and thus spot mode became less prone to being brought about.

In other words, in the case that carburization was carried out, it was found that if the number of grain boundaries per unit length on a straight line that passes through the approximate center of an arbitrary section in the radial direction of the protruding part is not more than 100 per mm, then arc-wandering is not brought about, and there is no deformation over a prolonged time.

Possible shapes of the protruding part at the cathode tip used in the mercury lamp according to the present invention are shown in FIG. 4(a) to (j); the effects of the present invention can be obtained with any of the shapes.

It is possible to provide a short arc type mercury lamp according to which desired electrons can be discharged even if the temperature of the cathode is low, contraction and wandering of the arc spot of the arc are suppressed, the cathode shape is not prone to deformation even if the lamp is lit for a long time, and fluctuation in the irradiance is suppressed.

According to the invention of claim 1, in the case of a short arc type mercury lamp, by stipulating the number of grain boundaries per unit length on a straight line that passes through the approximate center of an arbitrary section in the radial direction of the protruding part at the cathode tip to be at least 0.5 per mm, it is possible to produce a lamp with which spot mode is not brought about.

Moreover, by stipulating the number of grain boundaries to be not more than 100 per mm, it is possible to provide a lamp which causes little deformation of the cathode and little change in the luminescent spot, even in the case of a mercury lamp having a protruding part at the cathode tip, whose cathode temperature is more prone to becoming high.

Moreover, according to the invention of claim 2, if at least part of the side of the cone-shaped part of the cathode and so on is carbonized so that thorium is supplied smoothly, then it becomes easy to supply sufficient thorium from the cathode side to the cathode tip. Emission of thermoelectrons is possible at a lower temperature with thorium than with tungsten. Consequently, emission of thermoelectrons becomes possible over a broader range than in the case that carburization is not carried out, and hence the load on the cathode can be reduced. In this case, there is no problem even if the cathode tip is monocrystalline.

What is claimed is:

1. A short arc type mercury lamp in which a cathode and an anode are disposed opposite one another inside an arc tube, at least a noble gas and mercury are filled into the arc tube, cathode contains thorium oxide, a cone-shaped part that continues on from a cathode body is formed on the cathode, and a protruding part that continues on from the cone-shaped part is formed;

wherein the number of grain boundaries intersecting a straight line that passes through the approximate center of an arbitrary section in the radial direction of the protruding part is at least 0.5 per mm but not more than 100 per mm.

2. A short arc type mercury lamp in which a cathode and an anode are disposed opposite one another inside an arc tube, at least a noble gas and mercury are filled into the arc tube, cathode contains thorium oxide, a cone-shaped part that continues on from a cathode body is formed on the cathode, a protruding part that continues on from the cone-shaped part is formed, and at least part of the cone-shaped part and the cathode body is carbonized:

wherein the number of grain boundaries intersecting a straight line that passes through the approximate center of an arbitrary section in the radial direction of the protruding part is not more than 100 per mm.

* * * * *